United States Patent [19]
Nishizawa et al.

[11] Patent Number: 5,401,099
[45] Date of Patent: Mar. 28, 1995

[54] METHOD OF MEASURING JUNCTION TEMPERATURE

[75] Inventors: Hideaki Nishizawa; Masanori Nishiguchi; Atsushi Miki; Mitsuaki Fujihira, all of Yokohama, Japan

[73] Assignee: Sumitomo Electric Industries, Ltd., Osaka, Japan

[21] Appl. No.: 937,840

[22] PCT Filed: Feb. 10, 1992

[86] PCT No.: PCT/JP92/00130

§ 371 Date: Oct. 13, 1992

§ 102(e) Date: Oct. 13, 1992

[87] PCT Pub. No.: WO93/16489

PCT Pub. Date: Aug. 19, 1993

[51] Int. Cl.⁶ .................. G01K 7/00; G01K 15/00
[52] U.S. Cl. ........................... 374/178; 374/1; 257/467
[58] Field of Search ............... 374/178, 1; 257/467

[56] References Cited

U.S. PATENT DOCUMENTS

| | | | |
|---|---|---|---|
| 3,648,168 | 3/1972 | Ripplinger | 324/158 D |
| 3,659,199 | 4/1972 | Knutson | 324/158 D |
| 3,791,217 | 2/1974 | Stout et al. | 257/470 X |
| 4,106,341 | 8/1978 | Serrano | 257/470 X |
| 5,024,535 | 6/1991 | Winston, Jr. | 307/310 X |
| 5,159,520 | 10/1992 | Toyooka et al. | 257/470 X |

FOREIGN PATENT DOCUMENTS

| | | |
|---|---|---|
| 55-69067 | 5/1980 | Japan. |
| 60-76673 | 5/1985 | Japan. |
| 1110746 | 4/1989 | Japan. |

OTHER PUBLICATIONS

Publication: "Radar Electronics Fundamentals" Navy Dept. Navships 900,016, Jun. 1944, pp. 57–67.
Precisional Comparison of Surface Temperature Measurement Techniques for GaAs ICs, Masanori Nishiguchi et al. pp. 1–5, Laid–Open Feb. 14, 1991.

*Primary Examiner*—Diego F. F. Gutierrez
*Attorney, Agent, or Firm*—Cushman Darby & Cushman

[57] ABSTRACT

The present invention relates to a method of measuring junction temperature of a diode junction within a semiconductor device. The method has the steps of measuring current/voltage characteristics for various diodes at room temperature, determining an ideal factor for each diode, changing the temperature of the diodes to a selected temperature, remeasuring current/voltage characteristics for each diode, and comparing the measurements that have been made so as to obtain a temperature coefficients. The method also has the steps of measuring, at room temperature, a current/voltage characteristic of a diode to be utilized, determining an ideal factor from the measured current/voltage characteristic, determining a temperature coefficient corresponding to the ideal factor of by performing a linear interpretation between the ideal factors obtained for the various diodes, the ideal factor obtained for the diode, and the temperature coefficients of the various diodes, placing the diode where it will be used, measuring the current/voltage characteristic of the diode, determining the junction temperature of the diode from the temperature coefficient of the various diodes, the current/voltage characteristic of the diode at room temperature and where it will be used.

3 Claims, 11 Drawing Sheets

METHOD OF MEASURING JUNCTION TEMPERATURE

BACKGROUND OF THE INVENTION

1. Field of the Invention

This invention relates to a method of measuring a junction temperature of a semiconductor device, and more particularly to a method of measuring a junction temperature from the current/voltage characteristic of a Schottky diode.

2. Description of the Art

The junction temperature is defined as the temperature at various junctions (e.g., PN junction, etc.) within a semiconductor device, and is calculated by the sum of the environmental temperature and a temperature elevation which is due to the Joule heat of the junction. The junction temperature is one of the rated values of a semiconductor device. When the junction temperature exceeds a rated value, an increase in a leakage current, lowering of the long-term reliability, or breakdown may take place. For these reasons, measuring the junction temperature is an indispensable procedure in designing ICs, or constructing a system by using ICs.

As a method of measuring such junction temperatures of the semiconductor device is known as a diode method. For example, in the measurement of the junction temperature, which is necessary for conducting failure or fault analysis of a LED driver ICs, Schottky diodes for monitoring the temperature are provided at several portions within the IC pattern. This is because the forward voltage of the diode is very sensitive to changes in the junction temperature, and regularly varies with good reproducibility of results. By making use of this feature, some diodes are also used a temperature sensors.

The following formula is a formula for determining the current/voltage characteristics in a forward direction of the Schottky diode.

$$I_F \approx SAT^2 \exp\left(-\frac{q\Phi_B}{kT}\right)\exp\left(\frac{qV_F}{nkT}\right) \quad (1)$$

In formula (1), $I_F$ is a forward current, S is an area of Schottky contact, A is an effective Richardson constant, T is an absolute temperature, q is the charge of electron, $\Phi_B$ is a Schottky barrier height, k is a Boltzmann constant, $V_F$ is a forward voltage, and n is an ideal factor.

Transformation of the formula (1) produces:

$$V_F \approx \frac{nkt}{q} \ln\left(\frac{I_F}{SAT^2}\right) + n\Phi_B \quad (2)$$

In formula (2), k, q and A are constants, and $\Phi_B$, S and n are constants that are peculiar to individual diodes. Although $\Phi_B$ and n have a temperature dependency, these parameters can be considered to be substantially constant in a range from room temperature to about 150° C. Namely, since all of the parameters, except for the absolute temperature T, can be considered to be substantially constant in formula (2), it is possible to determine the absolute temperature (junction temperature) T from the forward voltage $V_F$.

Generally, in semiconductor devices including compounds such as GaAs, etc., Schottky barrier diodes that utilize a potential barrier which is produced at the contact portion of the metal electrode and the semiconductor are widely used. However, since the characteristic of the Schottky barrier diode is dependent upon the state of the surface (i.e., interfacial state) between the metal electrode and the semiconductor, and since it cannot be stated that uniformity or homogeneity of the compound semiconductor substrate is better than that of a silicon semiconductor substrate, there are great variations in the characteristics thereof.

The state of surface (i.e., interfacial state) is reflected in the ideal factor n in formula (2). In formula (2), n is related to all of the terms, and the differences in n are reflected in the forward voltage $V_F$. In order to facilitate the understanding of this concept, differentiating formula (2) by the absolute temperature T produces:

$$\text{(Temperature Coefficient) } T.C. = -\frac{\delta V_F}{\delta T} \quad (3)$$
$$= -\frac{nk}{q}\left(\ln\frac{I_F}{SAT^2} - 2\right)$$

The change of the ideal factor n in formula (3) is reflected by the temperature coefficient T.C. of the forward voltage $V_F$. Namely, if characteristics of the surface varies for any reason, so that the values of the ideal factors n are different for various diodes, the temperature coefficients T.C. of the forward voltages $V_F$ would also vary. Such a phenomenon is not rare, instead, it is quite ordinary for this to take place.

FIG. 1 is a graph showing measured temperature dependency curves of the forward voltages $V_F$ in connection with three Schottky diodes that were taken from the same wafer. The temperature dependency curves of the forward voltages $V_F$ of diodes 1 to 3 are different. This is based, in part, on the above-described differences in the state of the surfaces (interfacial state).

Since the forward voltage $V_F$ as stated above, does not have a predetermined relationship to the temperature thereof, it was necessary to: (1) change the ambient temperature; (2) measure dependency in the forward voltage $V_F$ with respect to temperature; and (3) thereafter perform the measurement of the junction temperature T in view of the dependency.

Since the measurement of the temperature dependency of the forward voltage $V_F$ takes too much time, this was an obstruction to implementation of efficient measurement of the junction temperature.

SUMMARY OF THE INVENTION

An object of this invention is to solve the above-described problems encountered with the prior art, and thereby provide an efficient measurement method for a junction temperature.

Namely, a method of measuring a junction temperature according to the present invention, comprises: a measurement preparatory stage wherein current/voltage measurements are performed on a diode at room temperature so as to determine an ideal factor and a forward voltage at room temperature. Thereafter, a temperature coefficient corresponding to the value of the ideal factor is read from a chart showing the relationship between the ideal factor and a temperature coefficient indicating a change in time of the forward voltage. Finally, a main or principal measurement stage takes place where the diode is placed under the circumstance where a junction temperature is desired to be actually measured. The forward voltage thereof is then measured so as to determine a junction temperature from the value of the forward voltage, the value of the previously determined forward voltage at the room temperature, and the temperature coefficient.

It is to be noted that the above-described chart is prepared by obtaining or determining the correlation between the ideal factor, which is obtained from the current/voltage characteristic of the diode measured at the room temperature and a value obtained by implementing linear approximation, and a temperature coefficient of the forward voltage measured by actually changing the ambient temperature.

In accordance with the above-mentioned measurement procedure, at the measurement preparatory stage, it is possible to estimate an ideal factor of the diode and a temperature coefficient corresponding thereto. Further, at the main or principal measurement stage, it is possible to calculate a junction temperature on the basis of those values. Accordingly, it is possible to predict a temperature dependency of the forward voltage without conducting actual measurements.

In addition, by using the chart prepared by obtaining or determining correlation between the ideal factor and the temperature coefficient, it is possible to estimate temperature coefficients for various diodes without conducting actual measurements.

DETAILED DESCRIPTION OF THE PREFERRED EXEMPLARY

A method of measuring of junction temperature according to this invention will now be described.

Figure 1:
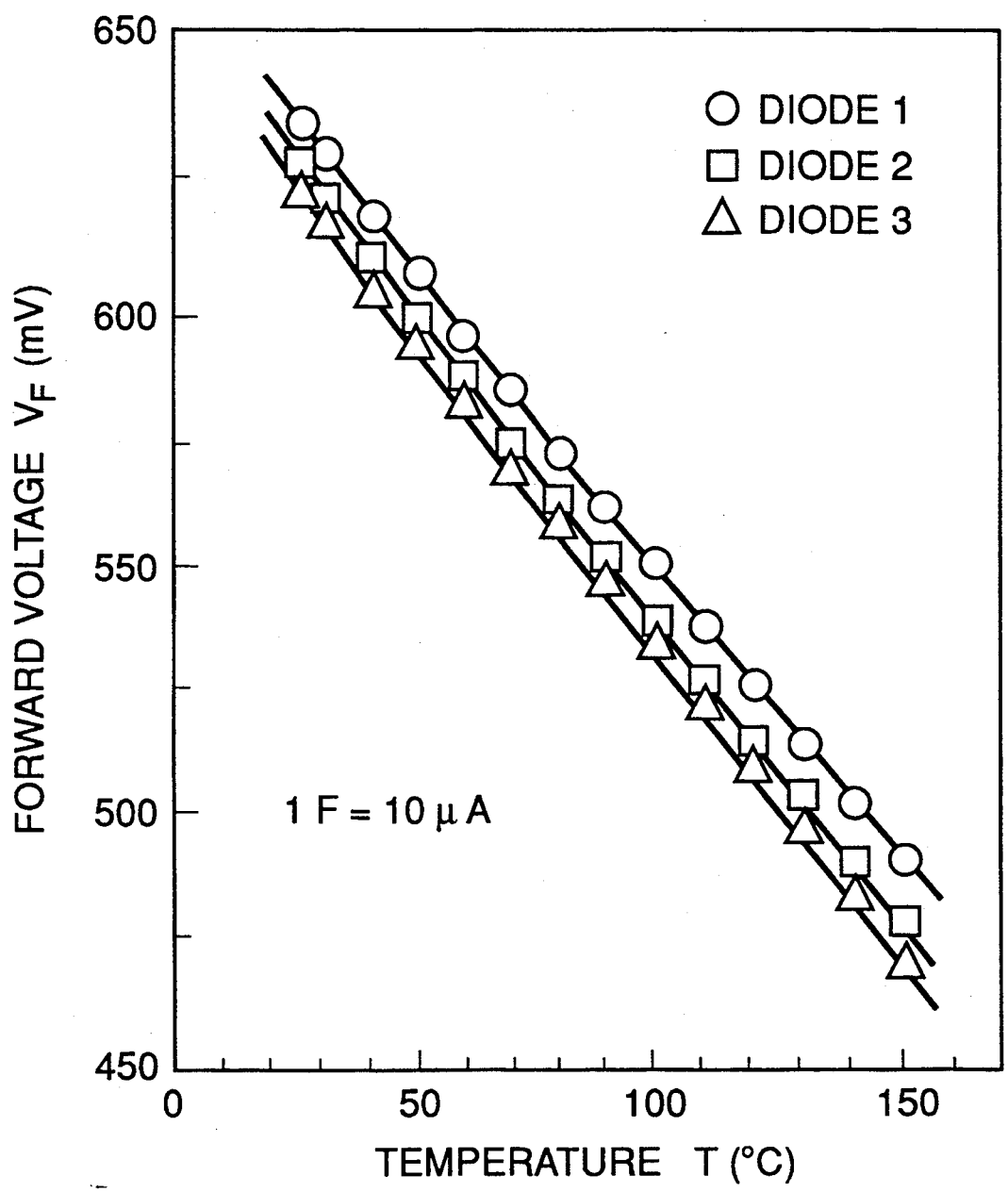
FIG. 1 is a graph showing that there is a divergence of the temperature dependency due to differences of the ideal factor n in a conventional measurement method.
Figure 2:
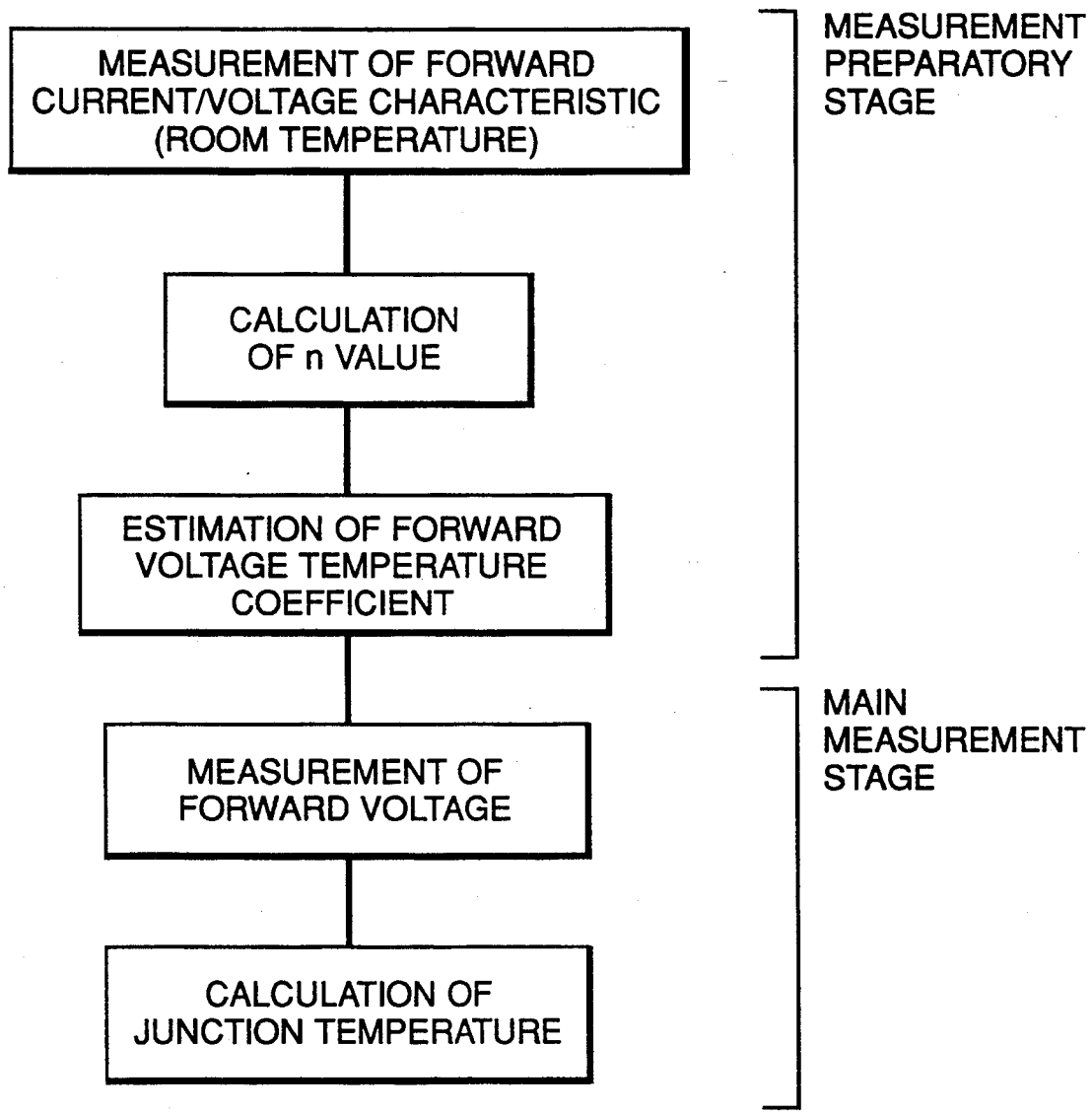
FIG. 2 is a flowchart of a method for measuring a junction temperature according to the present invention.

FIG. 2 is a flowchart of a method for measuring a junction temperature according to the present invention. First, current/voltage measurements at room temperature of a diode to be measured is performed, thus an ideal factor n and a forward voltage $V_F$ at the room temperature can be determined. Then, from the chart (shown in FIG. 3) which shows the relationship between an ideal factor n and a temperature coefficient T.C. and which is prepared in advance, a temperature coefficient T.C. corresponding to the value of the ideal factor n can be read. The outline of the measurement preparatory stage has been described as above.

The measurement procedures then enters the main or principal measurement stage. The diode is placed under conditions where a junction temperature is desired to be actually measured and a forward voltage $V_F$ thereof is measured. From this value of the forward voltage $V_F$, the value of the forward voltage $V_F$ determined at room temperature, and the estimated temperature coefficient T.C. at the previously mentioned measurement preparatory stage, a target or objective junction temperature can be calculated from the following formula:

$$\text{(Temperature Coefficient) } T.C. = -\frac{\delta V_F}{\delta T} \quad (3)$$

$$= -\frac{nk}{q}\left(\ln\frac{I_F}{SAT^2} - 2\right)$$

Figure 3:
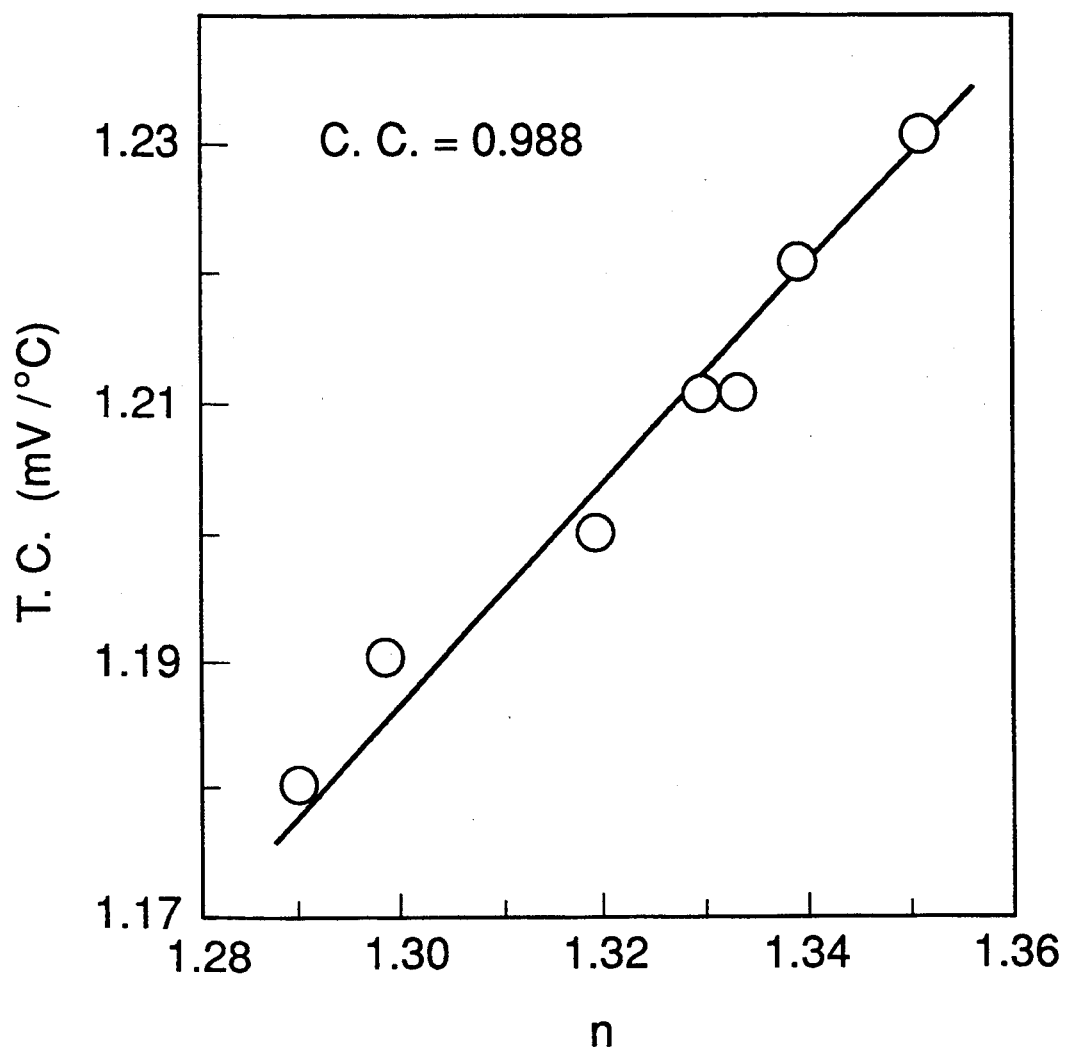
FIG. 3 is a graph showing the correlation between the ideal factor n at a room temperature and an actual measured temperature coefficient.

As the result of detailed study of the above formula (3), it became clear that a change of the term within parentheses of formula (3) is small in a range from room temperature to about 150° C., which is a temperature range desired to be measured. Furthermore, even if that change is considered to be substantially constant, a large error does not occur. Further, if the term in parentheses can be considered to be constant, the temperature coefficient T.C. in formula (3) will be proportional to the ideal factor n. Thus, by measuring the ideal factor n at a room temperature, it is possible to estimate the temperature coefficient T.C. In view of the foregoing, as the result of investigation into the correlation between the ideal factor n actually measured at a room temperature and the value obtained by actually changing the ambient temperature from 0° C. to 150° C. so as to implement linear approximation to the temperature coefficient T.C. of the forward voltage $V_F$, it was confirmed that there exists high a correlation of 0.988 as shown in FIG. 3. This correlation diagram is also the previously described chart.

Another diode was then used to determine the value of the ideal factor n thereof at a room temperature and so as to estimate a temperature coefficient T.C. by using that value of the ideal factor n and the chart shown in FIG. 3. Next, the temperature dependency of the forward voltage $V_F$ was measured by actually changing the ambient temperature of that diode. The results obtained by this procedure are shown in FIG. 4.

Figure 4:
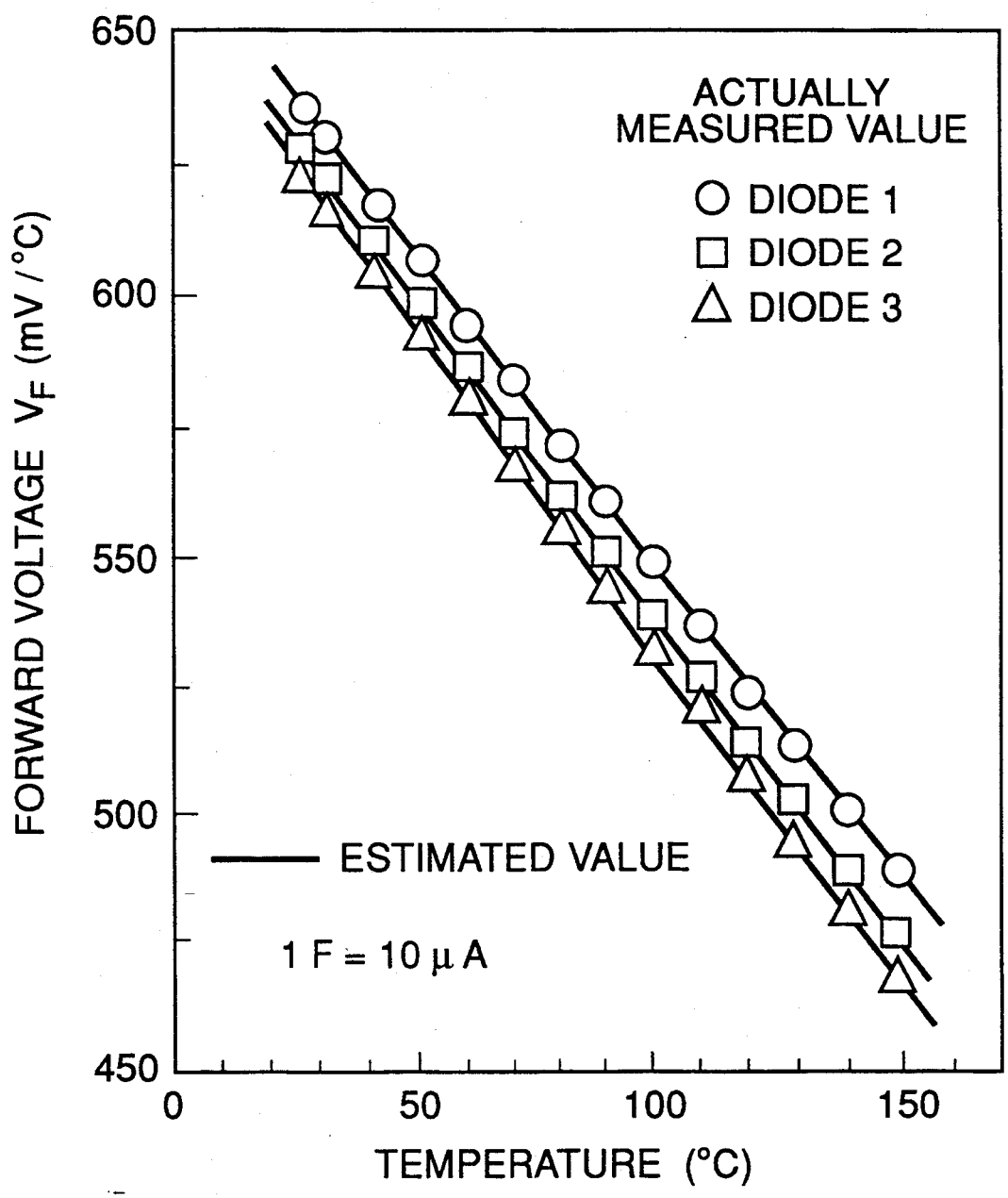
FIG. 4 is a graph showing the correspondence between dependency of a forward voltage determined by the method of measuring a junction temperature according to the present invention and an actual measured temperature dependency.

In FIG. 4, the solid lines represent temperature dependency curves of forward voltages $V_F$ estimated from the value of the ideal factor n at a room temperature. The circles, squares, and triangles represent measured values showing temperature dependency which was obtained by actually changing the ambient temperature. Differences between the estimated values and the actually measured values were within ±1° C.

The measurement method according to this invention has been described as above.

Since the inventors of this application have examined the temperature characteristic of the Schottky diode prior to implementation of the above-described measurement method, an experimental method thereof and the result thereof will now be described in detail.

In the experiment, a DRV2S in a mask RX-A for a reliability test was mounted on an 18 pin LCC (without lid).

Figure 5:
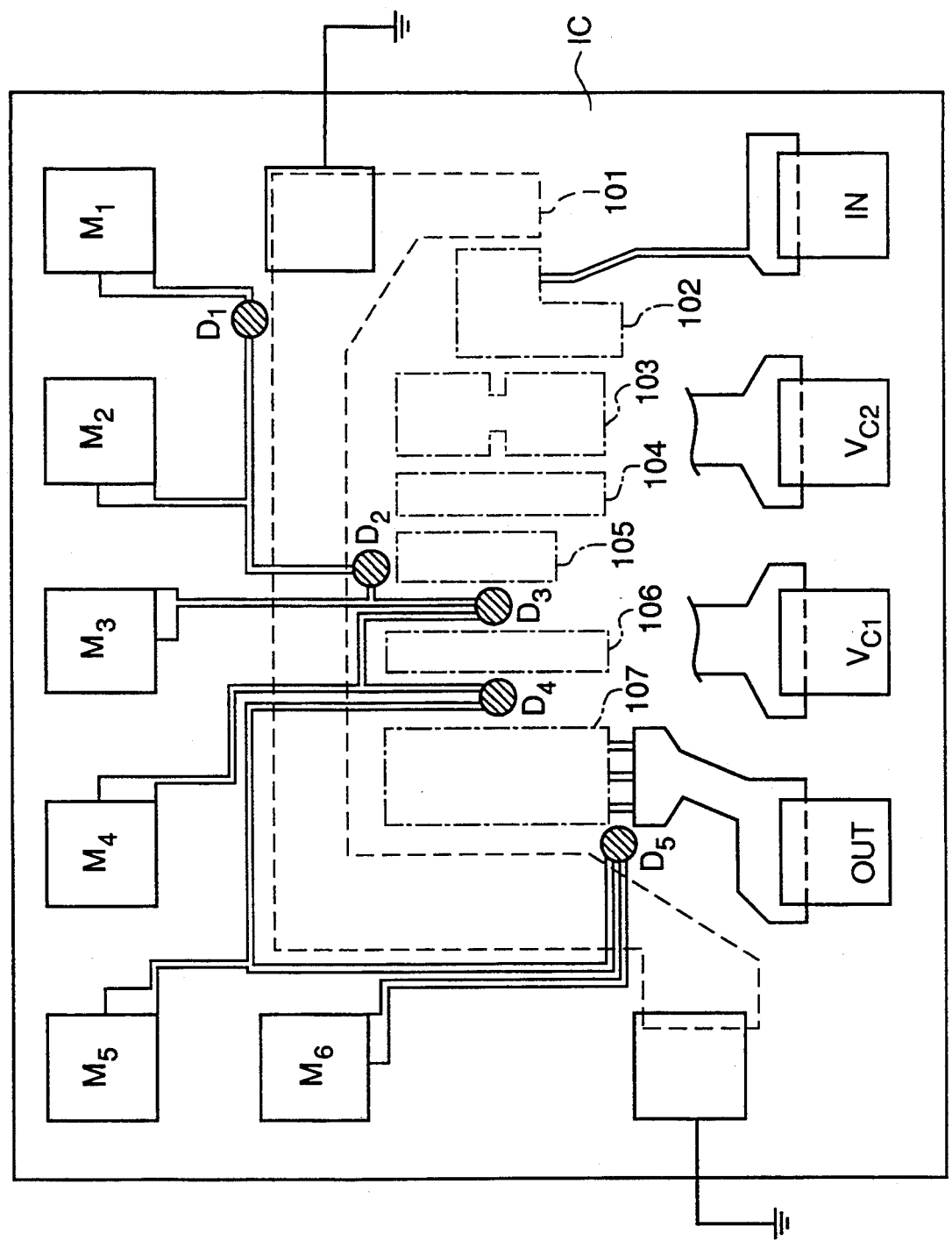
FIG. 5 is a schematic diagram showing a pattern of a chip used in this experiment.

FIG. 5 shows a pattern where Schottky diodes D1–D5 according to this invention are assembled in a circuit for driving an LED, which is formed on a GaAs chip. On the chip, there are formed a signal input circuit 102, which is comprised of MESFETs, a level shift circuit 103, which is comprised of diodes, an amplifier 104, which is comprised of MESFETs, and signal output circuit 105, 106, 107, which are comprised of MESFETs. In addition, a metal pattern 101 is connected to a ground potential.

Electrode pads M1–M6 on the chip are connected to the anodes and the cathodes of the temperature monitoring Schottky diodes D1–D5. Namely, the diode D1 is monitored by pads M1, M2; the diode D2 is monitored by pads M2, M3; the diode D3 is monitored by pads M3, M4; the diode D4 is monitored by pads M4, M5; and the diode D5 is monitored by pads M5, M6. The pad IN receives input drive pulses, and the pad OUT contains the output drive current for driving the LED. In addition pads VC1 and VC2 are supplied with power.

Figure 6:
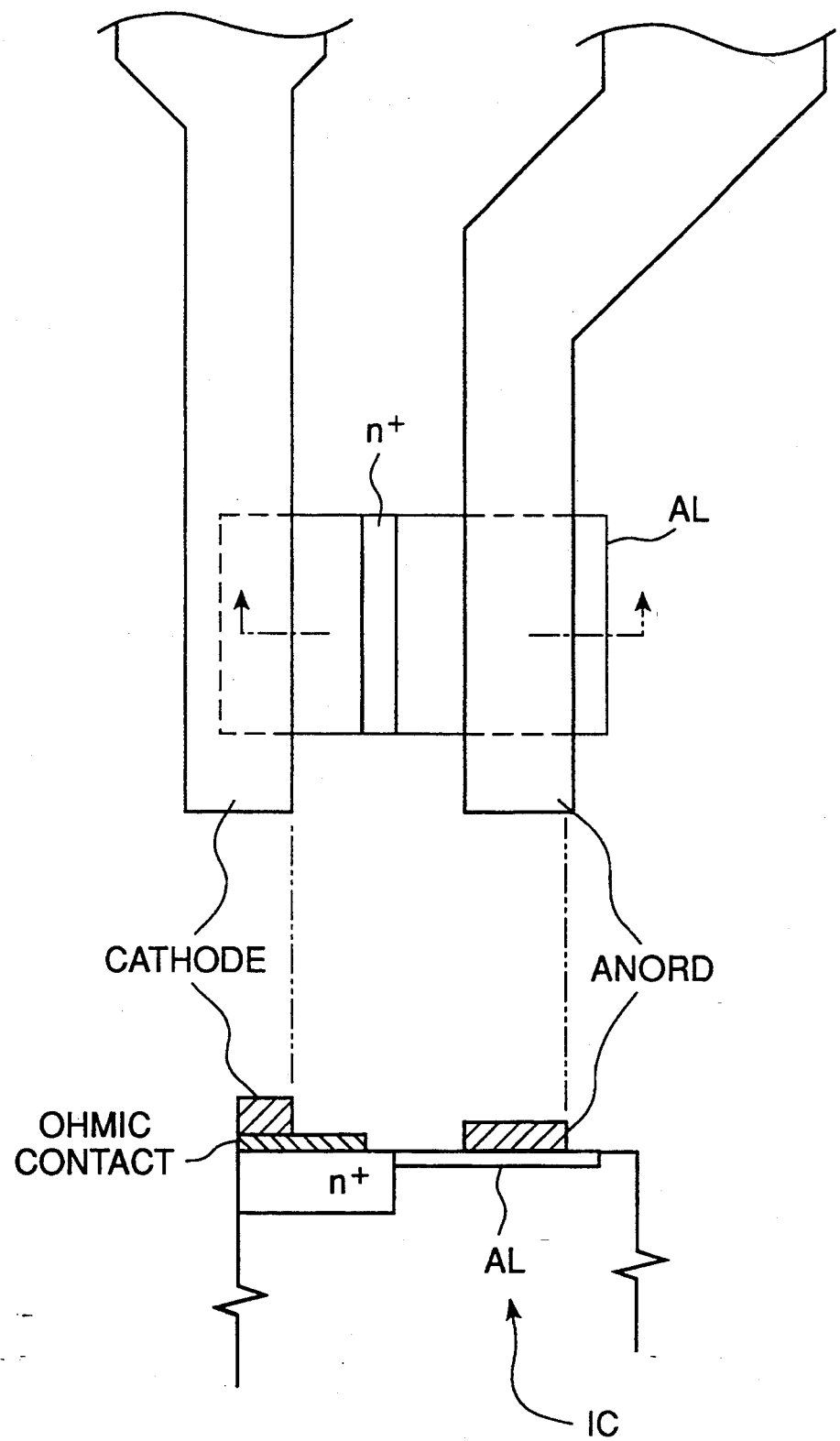
FIG. 6 is a view showing the configuration of a Schottky diode on the chip patter shown in FIG. 5.

FIG. 6 shows the top view and the cross-sectional view of the temperature monitoring Schottky diode of FIG. 5. An anode metal is in Schottky contact with an active layer (AL), and a cathode metal is formed of ohmic metal or contact of which is formed in an n+ region.

Figure 7:
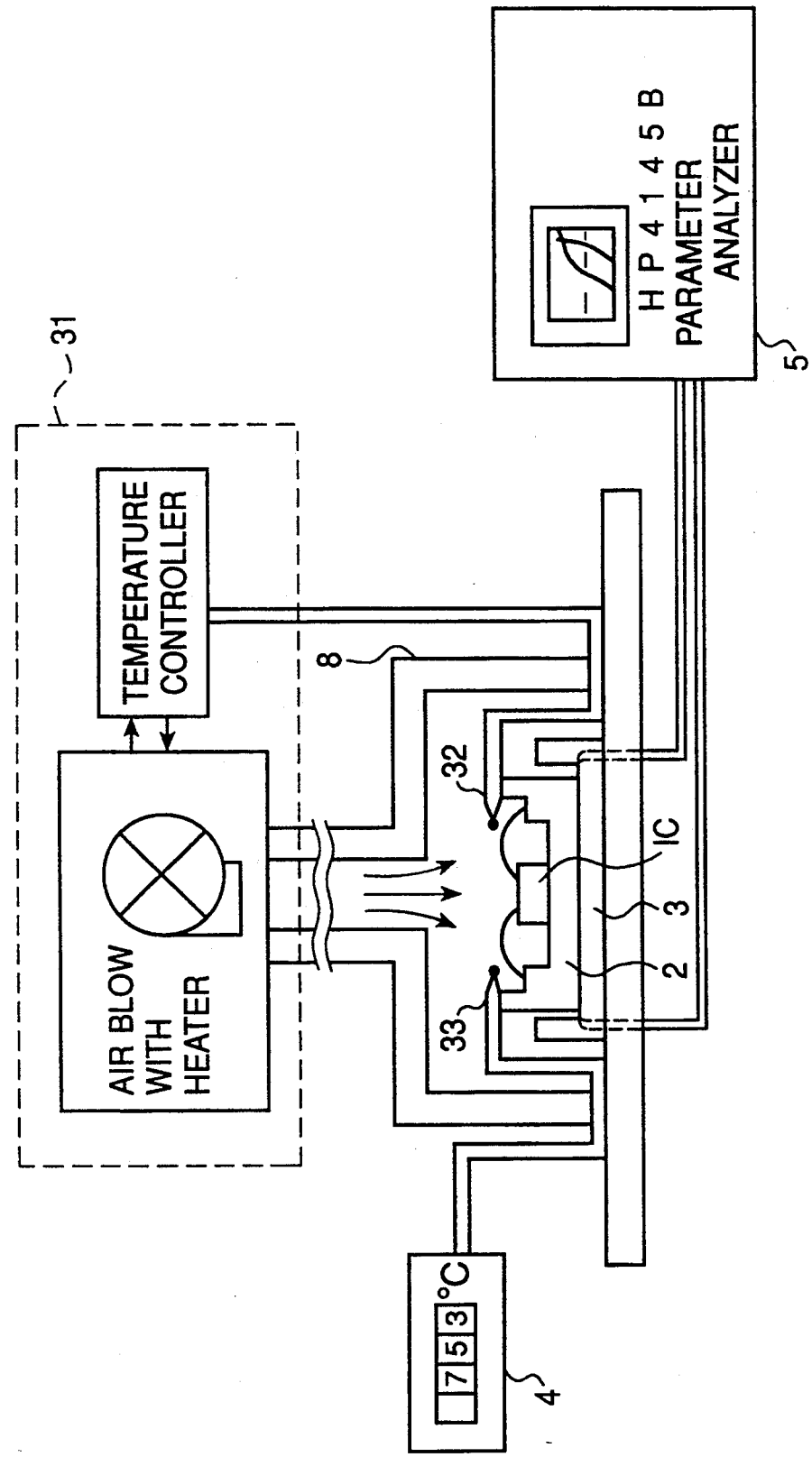
FIG. 7 is a view showing an outline of the measurement system.

FIG. 7 shows the outline of the system for measuring the temperature characteristic of the IC. A package 2 on which a chip is mounted is placed on a socket 3. These components or elements are installed within a rapid or quick temperature variable furnace 8. This rapid temperature variable furnace 8 is connected to a control unit 31 for controlling temperature of the interior of the furnace. Further, the package 2 and the socket 3 are connected to a digital thermometer 4 and a constant current power source and voltage monitor 5, respectively. In this experiment, the surface temperature of the chip was changed by the control unit 31 within the rapid temperature variable furnace 8. Monitoring of the temperature is carried out by using two thermocouples of a control thermocouple 32, which extended from the control unit 31, and a thermocouple 33, which was in the form of ribbon and which extended from the digital thermometer 4. Thermocouples 32 and 33 are disposed in the vicinity of package 2. Further, an HP4145B Parameter Analyzer 5 was used to supply constant current and to monitor voltage.

By this experimental system, temperature was changed in a range from 25° to 150° C. and a change in a forward voltage (V$_F$) necessary for allowing a fixed current (I$_F$) to flow in a forward direction was measured.

Figure 8:
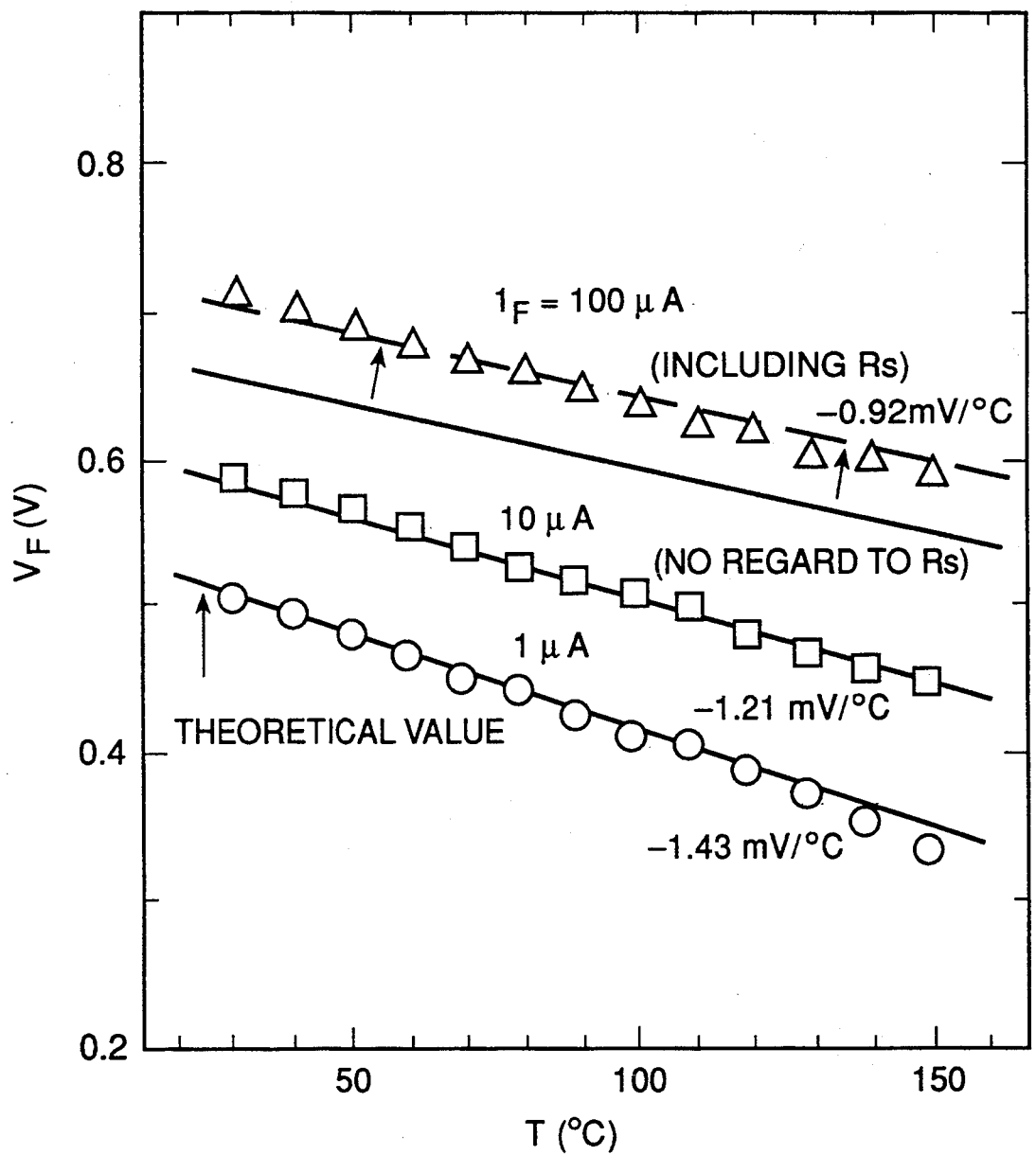
FIG. 8 is a graph showing the temperature dependency on $V_F$ of the Schottky diode.
Figure 9:
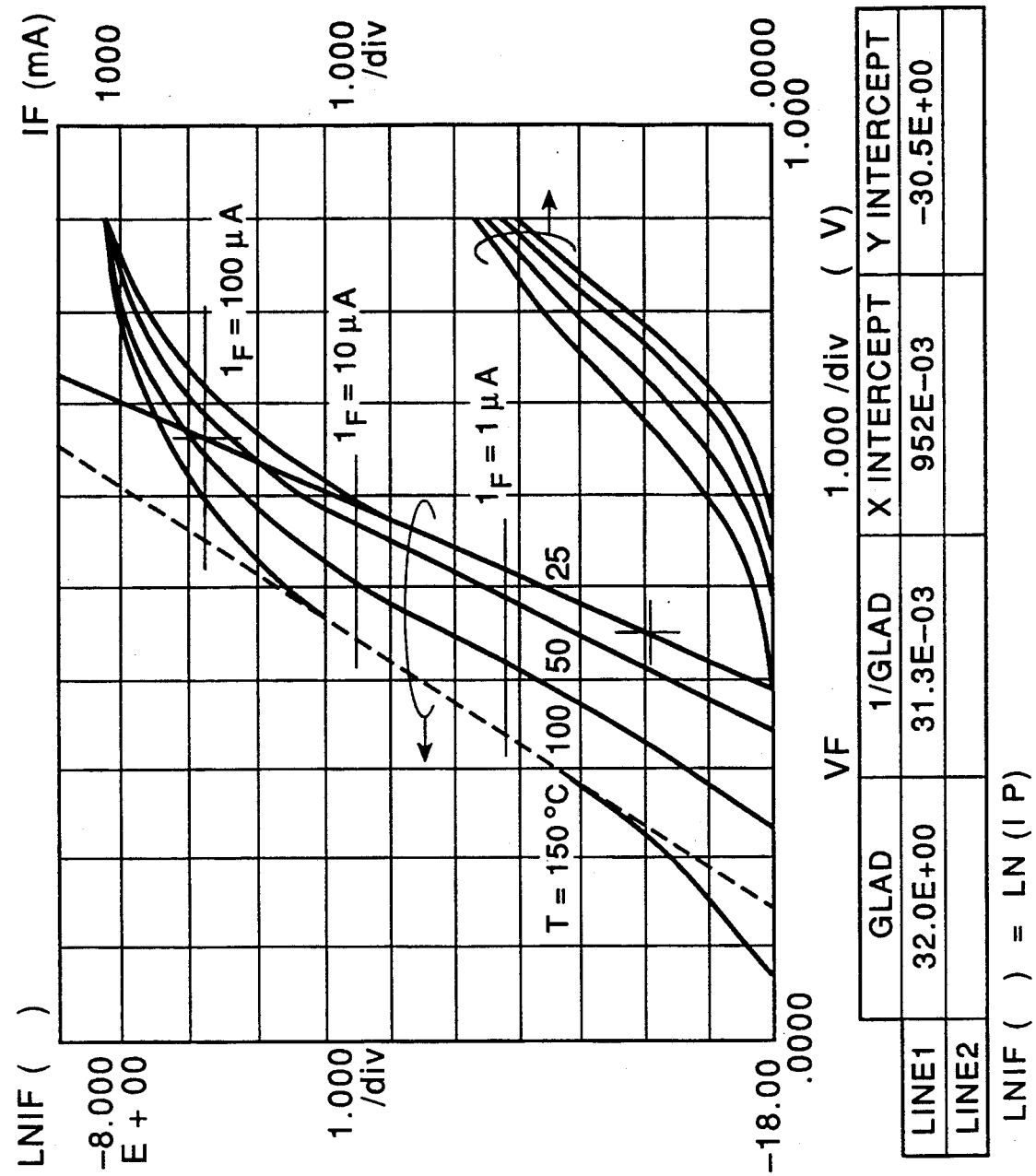
FIG. 9 is a graph showing a temperature dependency of the characteristic in a forward direction.

The measured result is shown in FIG. 8, wherein the abscissa represents temperature (°C.) and the ordinate represents forward voltage (V$_F$) changes were measured in connection with the cases where the forward current (I$_F$) was 1 μA and 100 μA. It is to be noted that the value of I$_F$ was selected from: (1) the portion near the center of the linear region; (2) the portion near the upper limit of the linear region; and (3) the non-linear region of the I$_F$-V$_F$ characteristic as plotted on the Semi-logarithmic scale at 25° C. as shown in FIG. 9. Further, in this range, there is no change, with respect to time, in the forward voltage when a forward current is applied. Thus, the heat produced by application of the forward current is negligible. In addition, hysteresis resulting from the sweeping direction of temperature was not observed.

The solid lines in FIG. 8 represent formula (1)

$$I_F \approx SAT^2 \exp\left(-\frac{q\Phi_B}{kT}\right)\exp\left(\frac{qV_F}{nkT}\right) \quad (1)$$

Furthermore, the broken lines represent the values in which V$_S$, which can be expressed by product of the series resistor Rs and I$_F$, is taken into consideration when I$_F$ is equal to 100 μA. It should be noted that since the temperature dependency of n and $\Phi_B$ in this range, as further described later, was small (shown in FIG. 10), this was also neglected. In addition, since the change of V$_S$ by the temperature dependency of R$_S$ is small as compared to the value of V$_F$, this was also neglected (shown in FIG. 11).

As shown in FIG. 8, the relationship of T-V$_F$ can be expressed by a line in the temperature range from a room temperature to about 150° C., and is in agreement with a theoretical value. Although the actual theoretical value cannot be expressed by line, it can be considered to be a line in this range of temperatures. In addition, the temperature coefficient, T.C. described in the figure is based on the result of the primary regression of the experimental data shown in Table 1.

TABLE 1

| | Result of Linear Regression Analysis for Experimental Data | | | | |
|---|---|---|---|---|---|
| | | | | Error (99% Confidence Level) | |
| | Linear Regression | Correlation Coefficient | Contribution Factor | | |
| I$_F$(μA) | Equation | R | R*R | V$_F$(V) | T(°C.) |
| 1 | V$_F$ = 0.557 − 1.43 × 10$^{-3}$ × T(°C.) | −0.999 | 99.84 | ±7.64 × 10$^{-3}$ | ±5.3 |
| 10 | V$_F$ = 0.557 − 1.21 × 10$^{-3}$ × T(°C.) | −1.000 | 99.93 | ±4.22 × 10$^{-3}$ | ±3.5 |
| 100 | V$_F$ = 0.557 − 9.18 × 10$^{-4}$ × T(°C.) | −1.000 | 99.90 | ±3.76 × 10$^{-3}$ | ±4.1 |

When attention is drawn to the result of the linear regression shown in Table 1, it is seen that when I$_F$ is equal to 10 μA, the contribution factor (R*R) takes on a maximum value of 99.93%, and the estimated temperature error takes a nimimum value of ±3.5° C. The reason why such results are obtained is as follows. Since the current of 1 μA is small, the measured results are apt to be affected by the environment. On the other hand, at 100 μA, contribution of the series resistance begins to have effect.

FIG. 9 shows a forward characteristic of a Schottky diode at 25° to 150° C. It is seen that as the temperature rises, the curve shifts to the left in the figure, and V$_F$ decreases. Further, in the case where $I_F$ is 1 μA, values change or shift at the portion near the central portions of the lines plotted in semi-logarithmic form. On the other hand, in the case where $I_F$ is 10 μA, values change or shift at the portion near the upper limit of the line portion. Further, in the case where $I_F$ is 100 μA, values change or shift in the non-linear region. It was previously described that the temperature dependency of $V_F$ was measured in connection with these three values of $I_F$. The temperature dependency curves of n and $\Phi_B$ were determined from such a graph as shown in FIG. 10, and the temperature dependency of $V_B$ was shown in FIG. 11.

Figure 10:
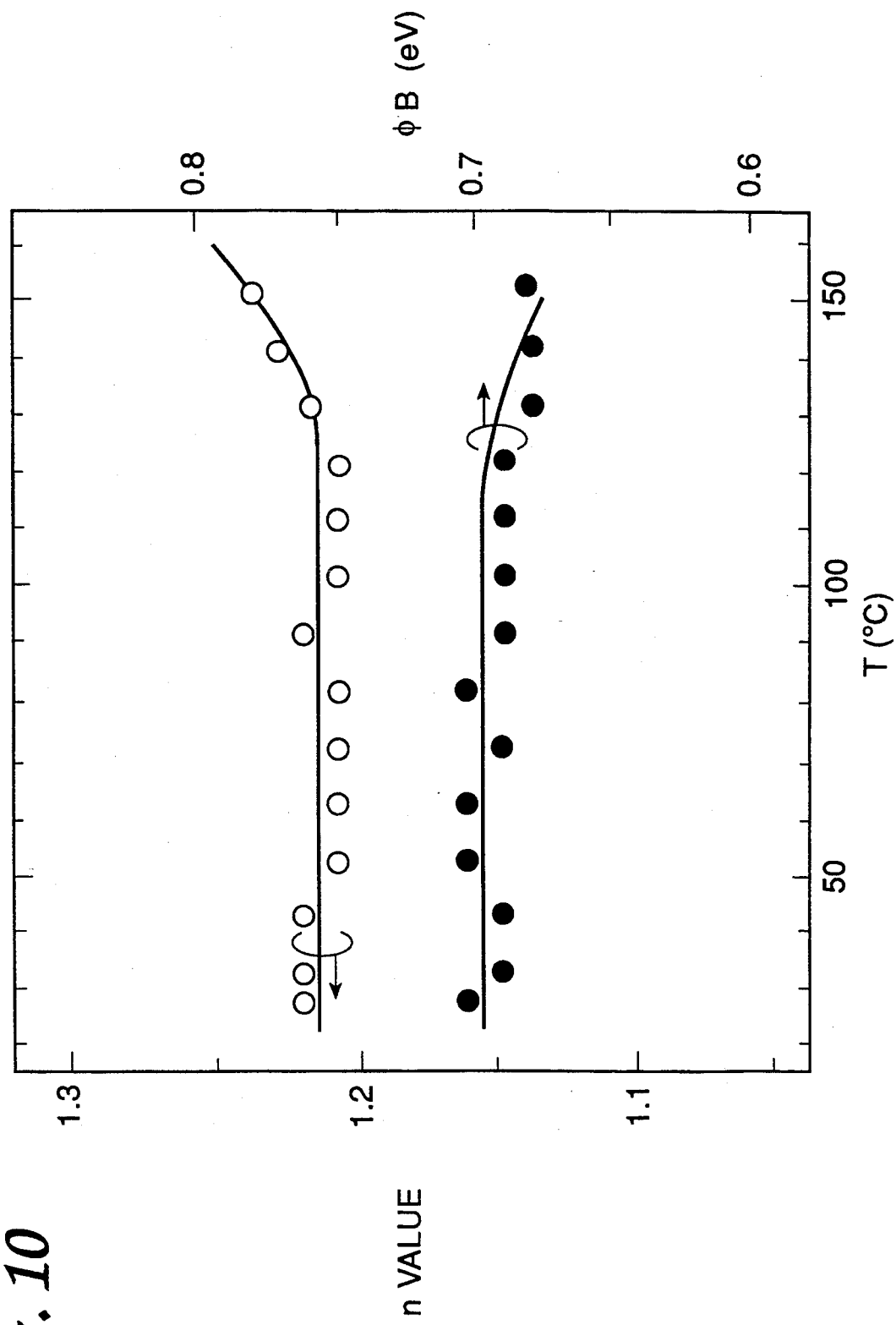
FIG. 10 is a graph showing the temperature dependency of n and $\Phi_B$ of the Schottky diode.
Figure 11:
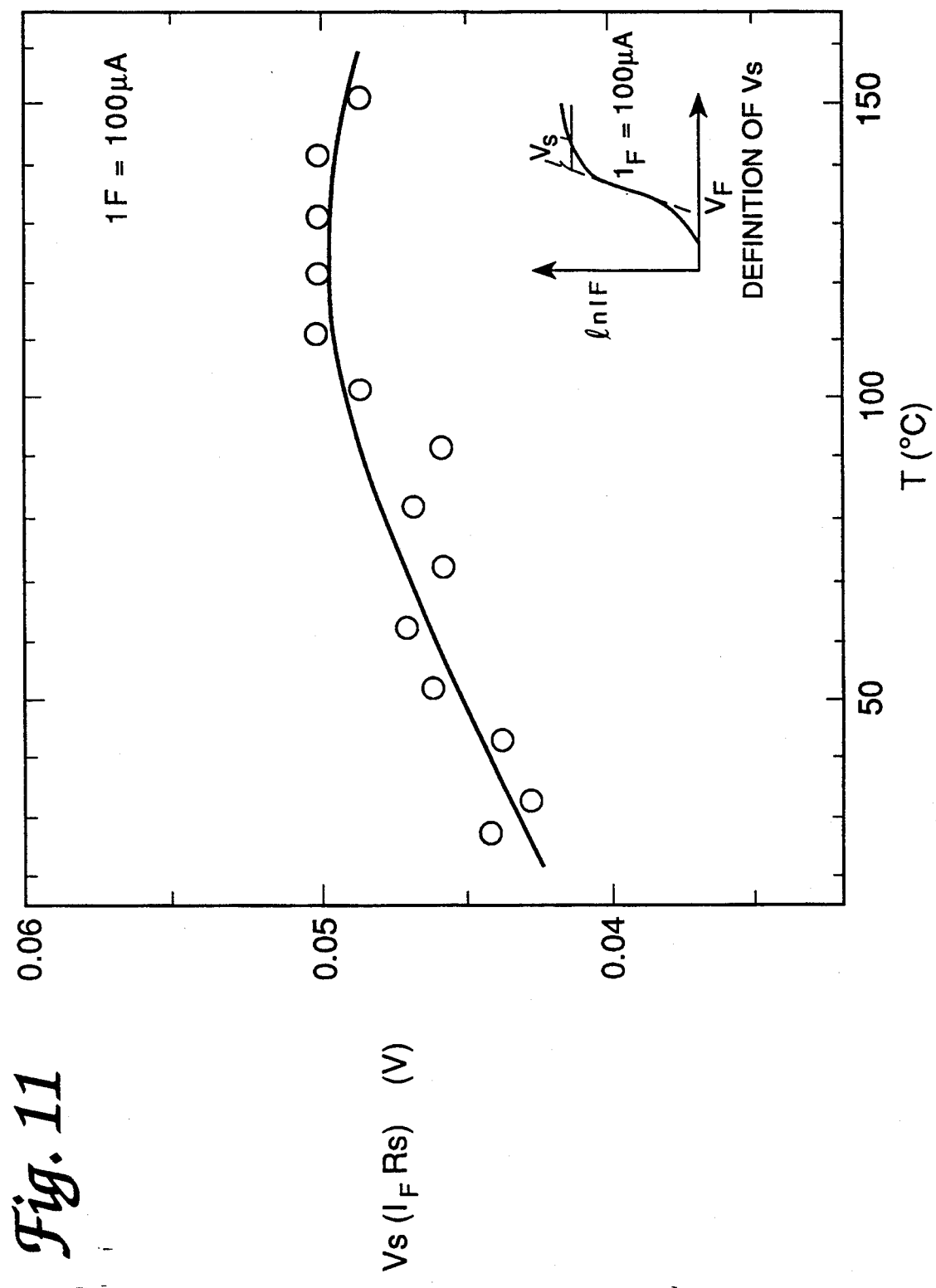
FIG. 11 is a graph showing the temperature dependency of Vs of the Schottky diode.

From FIG. 10, it is seen that there is a negligible temperature dependency of n and $\Phi_B$ in the range from about 25° to 120° C., and there is a tendency for n to increase, and for $\Phi_B$ to decrease starting at about 130° C. Since tails are observed in the high temperature/small current region in the plot in a semi-logarithmic form as shown in FIG. 9, it is considered that this phenomenon is based on an increase in the leakage current at the Schottky contact surface. In addition, the temperature dependency of $V_S$ shown in FIG. 11 shows a tendency similar to the calculated result, wherein the temperature dependency of mobility and the substrate leakage current are taken into consideration.

A similar experiment was conducted in connection with five samples in order to confirm the reproducibility of the results of the experiment and to determine an estimated error. It is to be noted that, while the measurement temperature interval was 10° C. in the previously mentioned experiment, the measurement temperature interval in this experiment is 5° C. Similarly to the prior results, the results of this experiment are obtained by implementing primary regression to $V_F$ and the temperature T(°C.) was shown in Table 2.

TABLE 2

Result of Linear Regression Analysis for Experimental Data
(Temperature Inverval of 5° C.)

| | Item | | | | |
|---|---|---|---|---|---|
| | Linear Regression | Correlation Coefficient | Contribution Factor | Error (99% Confidence Level) | |
| No. | Equation | R | R*R | $V_F$(V) | T(°C.) |
| 1 | $V_F = 0.596 - 1.20 \times 10^{-3} \times T(°C.)$ | −1.000 | 99.96 | ±2.72 × 10$^{-3}$ | ±2.3 |
| 2 | $V_F = 0.607 - 1.21 \times 10^{-3} \times T(°C.)$ | −1.000 | 99.97 | ±2.31 × 10$^{-3}$ | ±1.9 |
| 3 | $V_F = 0.615 - 1.23 \times 10^{-3} \times T(°C.)$ | −1.000 | 99.97 | ±2.18 × 10$^{-3}$ | ±1.8 |
| 4 | $V_F = 0.623 - 1.23 \times 10^{-3} \times T(°C.)$ | −1.000 | 99.96 | ±2.63 × 10$^{-3}$ | ±2.1 |
| 5 | $V_F = 0.617 - 1.21 \times 10^{-3} \times T(°C.)$ | −1.000 | 99.97 | ±2.47 × 10$^{-3}$ | ±2.0 |

It is seen that since the measurement temperature interval is small, the contribution factor is further improved up to about 99.96~99.97%. Thus, linear approximation can be carried out within a range of error of about ±2° C. (i.e., a reliability of 99%). However, since the temperature coefficient T.C. varies by 2~3%, depending upon the samples used, it is possible to determine a temperature coefficient in a manner as in the present experiment before performing the junction temperature measurement of the Schottky diode. However, in order to determine the distribution in the patter, measurements of a large number of Schottky diodes must be conducted. However, it is not easy to determine temperature coefficients T.C. in connection with all these diodes. Thus, an estimation of the degree of error of those temperature coefficients are caused to be a uniform value as shown in Table 3.

TABLE 3

Difference from measured values when temperature coefficient is assumed to be −1.22 mv/°C.

| | Item | | | |
|---|---|---|---|---|
| | Error When Linear Approximation is Implemented | | | |
| | $\Delta V_F$(V) | | $\Delta T$(°C.) | |
| | Range | | | |
| No. | 25-125° C. | 125-150° C. | 25-125° C. | 125-150° C. |
| 1 | ±1 × 10$^{-3}$ | ±1 × 10$^{-3}$ | ±0.8 | ±0.8 |
| 2 | ±1 × 10$^{-3}$ | ±1 × 10$^{-3}$ | ±0.8 | ±0.8 |
| 3 | ±4 × 10$^{-3}$ | ±5 × 10$^{-3}$ | ±1.6 | ±4.1 |
| 4 | ±4 × 10$^{-3}$ | ±6 × 10$^{-3}$ | ±3.3 | ±4.9 |
| 5 | ±1 × 10$^{-3}$ | ±1 × 10$^{-3}$ | ±0.8 | ±0.8 |

In that table, the error $\Delta T$, in which the temperature coefficients T.C. are considered to be uniformly −1.22 mV/°C. with the measured value of $V_F$ at 25° C., are used as a reference as shown with respect to the five samples. Furthermore, as the temperature rises, an increase in the leakage current and/or an increase in the temperature dependency of n and $\Phi_B$ takes place (shown in FIGS. 9 to 11). THus, deviation from the regression becomes large. For this reason, estimation was conducted in connection with two temperature ranges (i.e., 25° to 125° C. and 125° to 150° C.). From this, it is seen that measurements can be performed with an error of about ±3° C. within the temperature range from 25° to 125° C., and about ±5° C. within the temperature range from 125° to 150° C.

By the temperature characteristic measurement result of the Schottky diode which has been described, in order to efficiently carry out measurements with a reduced error, the inventors of this application prepared in advance a chart showing the correlation between the temperature coefficient T.C. and the ideal factor n based on the above-mentioned experimental method.

By using this chart, the necessity of measuring temperature coefficeints T.C., etc. in connection with individual diodes is eliminated. Thus, it is possible to efficiently carry out the previously described method of measuring the junction temperature.

INDUSTRIAL APPLICABILITY

In accordance with the junction temperature measurement method according to this invention, it is possible a temperature dependency of the forward voltage from the result of a very simple measurement of the ideal factor n at a room temperature. As a result, measurements of the temperature dependency on the forward voltage, which was conventionally required, has become unnecessary. Thus, measurement of the junction temperature can be efficiently carried out within a short time.

In addition, there is no necessity of obtaining, by actual measurements, temperature coefficients, etc. of individual diodes, thus making it possible to carry out a more efficient junction temperature.

We claim:

1. A method of measuring junction temperature of a diode junction within a semiconductor device, comprising the steps of:
   a) measuring current/voltage characteristics for various diodes at room temperature;
   b) determining an ideal factor for each diode used in step a based on the formula:

$$I_F = SAT^2 \exp\left(-\frac{q\Phi_B}{kT}\right) \exp\left(\frac{qV_F}{nkT}\right)$$

wherein:
   $I_F$ is a forward current;
   S is the area of the Schottky contact;
   A is an effective Richardson constant;
   T is an absolute temperature;
   q is the charge of an electron;
   $\Phi_B$ is a Schottky barrier height;
   k is a Boltzmann constant;
   $V_F$ is a forward voltage; and
   n is an ideal factor;
   c) changing the temperature of the diodes used in step a to a selected temperature, the selected temperature being different than the room temperature;
   d) measuring current/voltage characteristics for each diode used in step c;
   e) comparing the measurements obtained in step d with the measurements obtained in step a, so as to obtain a temperature coefficient for each diode used in step a;
   f) measuring, at room temperature, a current/voltage characteristic of a diode to be utilized;
   g) determining an ideal factor from the measured current/voltage characteristic of the diode used in step f based on the formula used in step b;
   h) determining a temperature coefficient corresponding to the ideal factor obtained in step g by performing a linear interpolation between the ideal factors obtained in step b, the ideal factor obtained in step g, and the temperature coefficients obtained in step e;
   i) placing the diode used in step f where it will be used;
   j) measuring a current/voltage characteristic of the diode used in step f;
   k) determining the junction temperature of the diode used in step f from the temperature coefficient determined in step h, the current/voltage characteristic measured in step f, and the current/voltage characteristic measured in step j.

2. A method of measuring junction temperature according to claim 1, wherein the linear interpolation recited in step h is accomplished by the use of a chart showing a relationship between the ideal factors determined in step b and the temperature coefficients obtained in step e.

3. A method of measuring junction temperature according to claim 1, wherein the selected temperature recited in step c is below 150° C.

* * * * *